United States Patent
Bielmeier et al.

(10) Patent No.: US 10,288,710 B2
(45) Date of Patent: May 14, 2019

(54) METHOD AND MAGNETIC RESONANCE APPARATUS WHEREIN LIMIT VALUES ARE OBSERVED WHEN RECORDING MAGNETIC RESONANCE DATA

(71) Applicant: Siemens Healthcare GmbH, Erlangen (DE)

(72) Inventors: Wolfgang Bielmeier, Erlangen (DE); Gerhard Brinker, Erlangen (DE); Swen Campagna, Engelthal (DE); Nikolaus Demharter, Dormitz (DE); Bernd Erbe, Erlangen (DE); Matthias Gebhardt, Erlangen (DE); Juergen Nistler, Erlangen (DE); Dominik Paul, Bubenreuth (DE); Carsten Prinz, Baiersdorf (DE); Gudrun Ruyters, Erlangen (DE); Stephan Stoecker, Baiersdorf (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 96 days.

(21) Appl. No.: 15/499,170

(22) Filed: Apr. 27, 2017

(65) Prior Publication Data
US 2017/0315195 A1 Nov. 2, 2017

(30) Foreign Application Priority Data

Apr. 28, 2016 (DE) .................. 10 2016 207 264

(51) Int. Cl.
*G01V 3/00* (2006.01)
*G01R 33/54* (2006.01)
(Continued)

(52) U.S. Cl.
CPC .......... *G01R 33/543* (2013.01); *G01R 33/36* (2013.01); *G01R 33/385* (2013.01)

(58) Field of Classification Search
CPC .............. G01R 33/543; G01R 33/4824; G01R 33/4835; G01R 33/5608; G01R 33/3852;
(Continued)

(56) References Cited

U.S. PATENT DOCUMENTS

2004/0263166 A1 12/2004 Kluge
2011/0043204 A1 2/2011 Bielmeier et al.
(Continued)

OTHER PUBLICATIONS

International Standard IEC 60601-2-33, Edition 3.0, Amendment 2 (2015) (English lanugage portion only).

*Primary Examiner* — Rodney E Fuller
(74) *Attorney, Agent, or Firm* — Schiff Hardin LLP

(57) ABSTRACT

In a magnetic resonance (MR) apparatus and an operating method therefor, a sequence with which the MR data are to be recorded is created in or provided to a control computer of the MR apparatus. A maximum RF output and a maximum gradient performance of the scanner magnetic resonance apparatus during the performance of the sequence are determined by simulating or analyzing the performance of the sequence in the control computer, and it is verified whether the maximum RF output and/or the maximum gradient performance violate predetermined limit values. Execution of the sequence to record the MR data is performed only if the verification showed that the limit values are not violated.

10 Claims, 2 Drawing Sheets

(51) Int. Cl.
*G01R 33/36* (2006.01)
*G01R 33/385* (2006.01)

(58) Field of Classification Search
CPC ............ G01R 33/3854; G01R 33/4822; G01R 33/4833; G01R 33/5602; G01R 33/561; G01R 33/56509; G01R 33/56563; G01R 33/5659; A61B 5/055
USPC ......................................................... 324/309
See application file for complete search history.

(56) References Cited

U.S. PATENT DOCUMENTS

| | | | |
|---|---|---|---|
| 2013/0249548 A1* | 9/2013 | Stemmer ............ | G01R 33/4835 324/309 |
| 2013/0271139 A1* | 10/2013 | Grodzki ............... | G01R 33/543 324/314 |
| 2014/0210471 A1* | 7/2014 | Stemmer .......... | G01R 33/56554 324/309 |
| 2014/0292334 A1* | 10/2014 | Kaneko ................. | A61B 5/055 324/309 |
| 2015/0097566 A1* | 4/2015 | Grodzki ............... | G01R 33/288 324/322 |
| 2015/0204953 A1* | 7/2015 | Ookawa ............... | G01R 33/543 324/309 |
| 2015/0212179 A1* | 7/2015 | Overall ................ | G01R 33/543 324/309 |
| 2015/0285885 A1* | 10/2015 | Feiweier .............. | G01R 33/288 324/309 |
| 2015/0293190 A1* | 10/2015 | Paul .................... | G01R 33/543 324/309 |
| 2015/0309147 A1* | 10/2015 | Schmitter ............ | G01R 33/543 600/410 |
| 2017/0059670 A1 | 3/2017 | Gebhardt et al. | |
| 2017/0146631 A1* | 5/2017 | Beck ................... | G01R 33/4833 |
| 2017/0176561 A1* | 6/2017 | Grodzki ............... | G01R 33/385 |
| 2017/0248673 A1* | 8/2017 | Kang .................... | A61B 5/055 |
| 2017/0261583 A1* | 9/2017 | Grodzki ............... | G01R 33/543 |
| 2018/0038928 A1* | 2/2018 | Wiesinger ........... | G01R 33/50 |
| 2018/0120401 A1* | 5/2018 | Shin ................... | G01R 33/3852 |

* cited by examiner

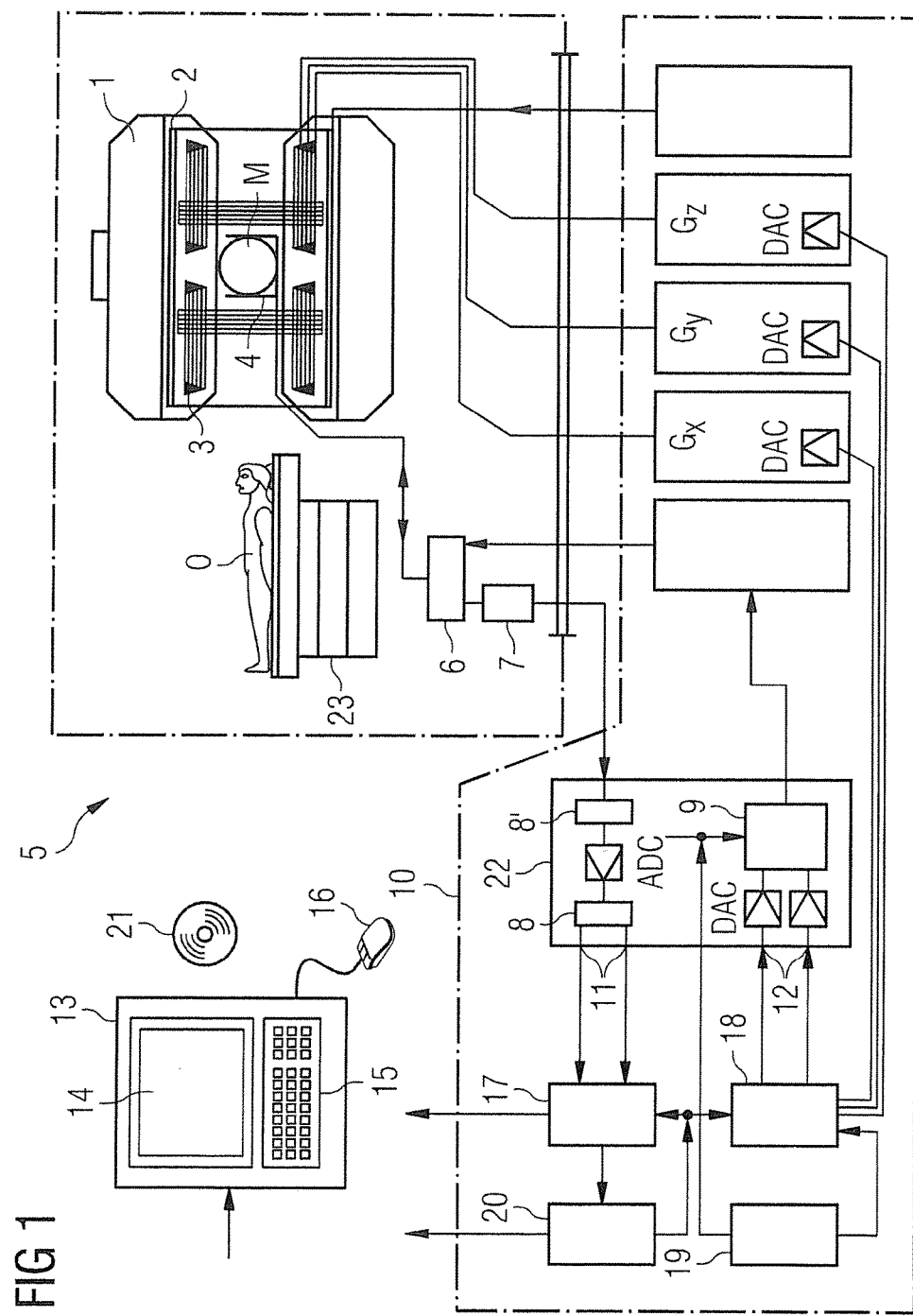

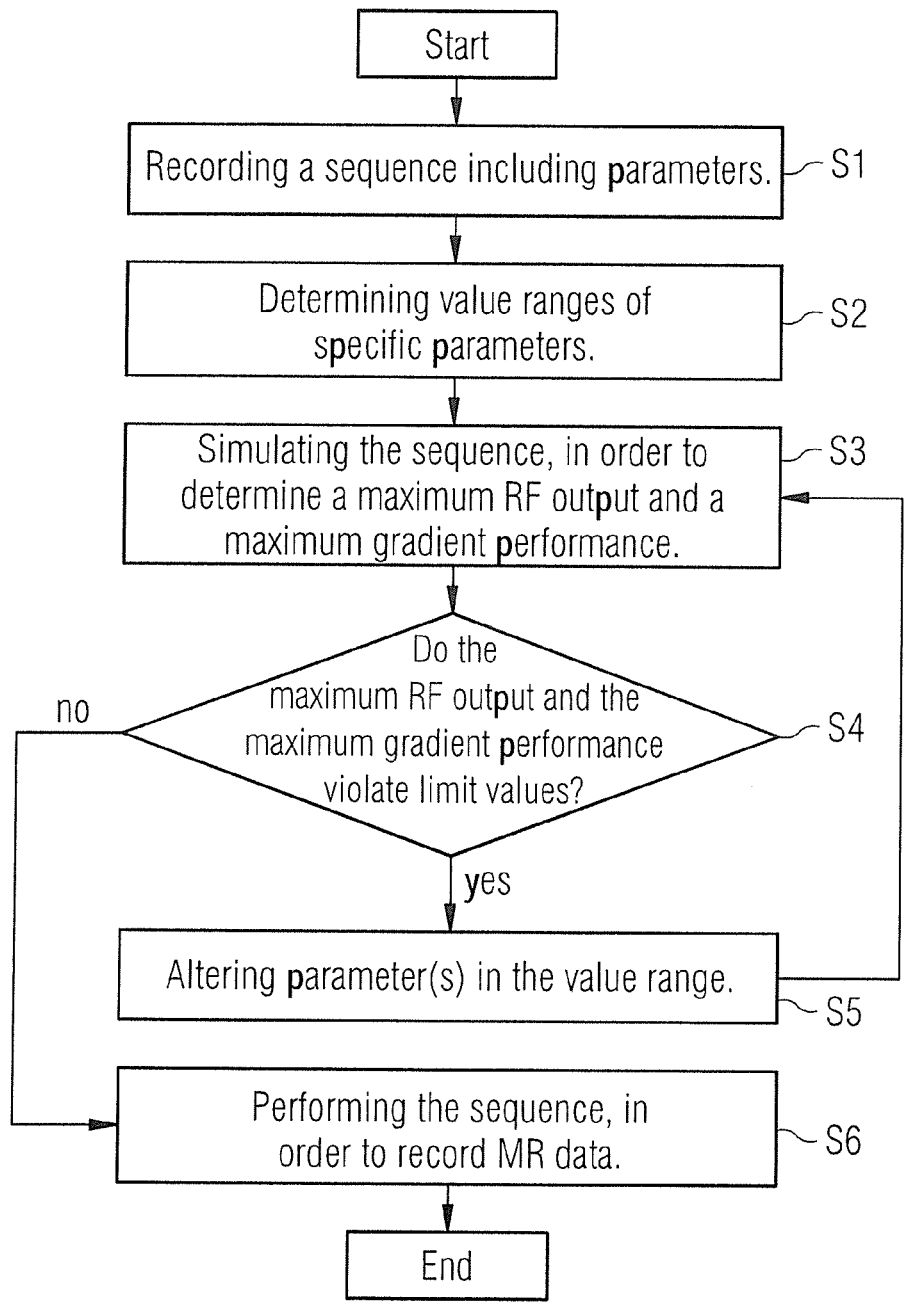

METHOD AND MAGNETIC RESONANCE APPARATUS WHEREIN LIMIT VALUES ARE OBSERVED WHEN RECORDING MAGNETIC RESONANCE DATA

BACKGROUND OF THE INVENTION

Field of the Invention

The present invention relates to the recording of magnetic resonance (MR) data of a living examination object with the use of a magnetic resonance apparatus, wherein it is ensured that specific limit values are observed.

Description of the Prior Art

Following Amendment 2 to the third edition of the IEC standards 60601-2-33, which has been applicable since spring 2015, it is possible to examine patients with certain implants (cardiac pacemakers, implanted defibrillators, etc.) using a magnetic resonance system. In this case, certain limit values regarding RF pulses and gradient fields must be observed while MR data of these patients are recorded. Furthermore, the implants must also comply with the corresponding standard.

In order to enable a patient with an implant to be examined by a magnetic resonance system, such a magnetic resonance system has a specific option (FPO ("Fixed parameter Option") especially for this purpose. Selecting or setting this option for the magnetic resonance system ensures that certain limit values are not violated when the MR data of the patient are being recorded by the magnetic resonance system. To this end, magnetic resonance systems must operate using the option FPO:B (Basic), which is described in Amendment 2 to the third edition of IEC standard 60601-2-33.

When a magnetic resonance system is operated using the option FPO:B and when this magnetic resonance system detects that the limit values are being violated when recording MR data of the patient, recording of the MR data is abruptly interrupted automatically by the magnetic resonance system. In other words, only part of the proposed MR data is collected by the magnetic resonance system, enabling only a few MR images to be produced for examination of the patient, or none at all.

SUMMARY OF THE INVENTION

An object of the present invention is to avoid the interruption of the recording of MR data even if the magnetic resonance system is operated using the option FPO:B.

The method of the present invention for recording MR data of an examination object with the operation of a magnetic resonance system has the following steps.

In a control computer of an MR apparatus, creating or receiving an imaging sequence acquired with which MR data of the examination object are to be acquired. In this step, the computer ascertains certain parameters (e.g. dimensions of the volume section to be recorded, resolution, number of slices, type of sequence, etc.) in order to be able to precisely define the imaging sequence based on these parameters.

The maximum RF output and the maximum gradient performance of the MR data acquisition scanner of the magnetic resonance apparatus, which will occur during performance of the imaging sequence are determined in the computer by at least partially simulating the performance of the sequence. In this step, the control computer at least partially simulates or analyzes or calculates the previously created or received imaging sequence, in order to determine the maximum RF output, particularly during emission of the RF excitation pulses, and the maximum gradient performance particularly during switching of the gradient moments, based on this simulation (or analysis or calculation).

To determine the maximum RF output, usually any part of the imaging sequence can be simulated or analyzed, because the RF output is almost uniformly distributed throughout the imaging sequence. The gradient performance, however, is usually strongest when scanning the peripheral k-space points so that in this case it is sufficient to simulate or analyze the part of the imaging sequence during which the MR data of the peripheral k-space points are acquired in order to determine the maximum gradient performance.

The control computer verifies, through the simulation, whether the predetermined maximum RF output and/or the predetermined maximum gradient performance violate certain limit values set for the magnetic resonance apparatus. In particular, these limit values are the limit values specified by the option FPO:B.

The control computer then operates the scanner to execute the imaging sequence (i.e. acquisition of MR data using the imaging sequence) only if the prior verification showed that the limit values were not violated during the simulation. In other words, the imaging sequence is executed only if the prior simulation showed that the limit values were not violated at any time during performance of the imaging sequence.

Since it is already known by the simulation of the imaging sequence, before the performance of the imaging sequence, whether the predetermined limit values will be observed during the performance of the imaging sequence, and since the imaging sequence is executed only if it is known that the limit values are not violated, cancelation of the performance of the imaging sequence due to not satisfying the limit values is advantageously avoided. In other words, recording of MR data is started only when there is certainty that it will not result in cancelation due to violation of the limit values during the recording of MR data.

Verification of whether the maximum RF output and/or the maximum gradient performance violates or violate the predetermined limit values can involve at least one of the following verifications:

A first verification of whether a maximum value of the RF output (maximum B1 value) of the magnetic resonance system during the performance of the imaging sequence is greater than a first limit value of a first limit value for the magnetic flux density. The first limit value could be, for example, 30 µT.

A second verification of whether a temporal mean value of the RF output (maximum average B1 value) of the magnetic resonance system during the performance of the imaging sequence is greater than a second limit value for the magnetic flux density. While the first verification verifies whether a maximum of the RF output is above the first limit value, the second verification verifies whether over any period (for example, 100 ms) the temporal mean value of the RF output is greater over this respective period than the second limit value. A variation of the temporal mean value of the RF output is the quadratic mean of the RF output which is also known as RMS ("Root Mean Square") or effective value of the RF output. The second limit value could be, for example, 3.2 µT, i.e., for example, $B1_{RMS} \leq 3.2$ µT.

A third verification of whether a maximum value of an amount of a temporal change of the gradient performance (maximum value of |dB/dt|) of the magnetic resonance system during the performance of the imaging sequence is greater than a first limit value for a change of the magnetic flux density per time unit. In this third verification, whether the maximum value of the amount of the first derivative over the time of the gradient performance is above the corresponding limit value is therefore quasi verified. The first limit value could be, for example, 100 T/s.

A fourth verification as to whether a temporal mean value of an amount of a temporal change of the gradient performance (maximum value of the mean value of |dB/dt|) of the magnetic resonance system during the performance of the imaging sequence is greater than a second limit value for a change of the magnetic flux density per time unit. In this fourth verification, whether during any period (of, for example, 100 ms) the temporal mean value of the amount of the temporal change of the gradient performance is above the corresponding limit value is therefore quasi verified. A variation of this temporal mean value is the quadratic mean, also known as the effective value. The second limit could be 56 T/s, for example.

The exemplary limit values specified above in the first to fourth verifications are appropriate for a magnetic resonance scanner with a performance of 1.5 T.

In a preferred embodiment of the invention, verification as to whether the maximum RF output and/or the maximum gradient performance violate the predetermined limit values, if the limit values are violated, includes determination of which of the limit values is violated by which percentage.

This embodiment can be used, for example, for a lookahead function with which, for example, it is possible to verify whether the performance of the magnetic resonance scanner meets the FPO:B specifications during proposed recording of MR data. Based on the additional information, in case of violation, as to which of the limit values is violated and by which percentage, the proposed imaging sequence can then be adjusted accordingly.

According to a further preferred embodiment of the invention, at least one of the parameters of the imaging sequence is adjusted to a parameter value by the control computer such that the imaging sequence altered in this way does not violate the limit values during performance. In the process, the control computer tries to remain as close as possible to the original parameter value (i.e. the value of the respective parameter that was first created or received.

If the control computer in this embodiment detects, with the use of the simulation, that the imaging sequence would violate the limit values, the control computer alters one or more parameters of the imaging sequence such that recording the MR data with the imaging sequence altered in this way does not result in a violation of the limit values.

The determination of a parameter value of one or more parameters to avoid violation of the limit values can be performed with the use of a binary search. This binary search is performed for each limit value that is violated by the current sequence. One of the parameters is determined for this purpose in order to remedy the violation of the limit value through its alteration. The value of the respective parameter which this parameter has before the first run is called the original value. In the process, the following steps are performed.

During the first run of a first step, a still possible range of values is determined for the respective parameter. The still possible range of values is a range of values of the parameter within which parameter values are found, which would not result in a violation of the respective limit value according to the current state of simulation or analysis. During each run of the first step, the respective parameter is set to a value in the center of the still possible range of values.

With the use of a simulation, analysis or calculation, a second step verifies whether the respective limit value is violated by the altered sequence. I.e. if the respective parameter influences the maximum RF output (gradient performance), whether the altered sequence exceeds the limit value for the maximum RF output (gradient performance) is verified.

In a third step, the still possible range of values of the respective parameter is halved. If the simulation in step 2 showed that the altered sequence continued to violate the limit value, the half of the still possible range of values which is further from the original parameter value is selected, while otherwise the other half is selected. The binary search is canceled if a cancelation criterion (for example, a predetermined number of simulations for the respective parameter) is met. If the simulation in the second step had hitherto failed to show on a single occasion that the (altered) sequence no longer violated the limit value, the binary search is canceled with a negative result. Otherwise, the parameter value is set to the last parameter value found during the binary search, in which the simulation in the second step showed that the (altered) sequence no longer violates the limit value. If the cancelation criterion is not met, the binary search in the first step continues.

This binary search is repeated for all alterable parameters and all violated limit values until either a sequence was found in which the simulation showed that no limit values are violated, or until the binary search for a violated limit value for all the alterable parameter was performed unsuccessfully.

This iterative approach or binary search to determine parameters of the imaging sequence which do not result in a violation of the limit values has the advantage, compared with other approaches that the parameters can be determined in a comparatively short computing time and the altered parameter values are still as close as possible to the original values.

The following variations exist regarding the aforementioned binary search.

According to a preferred variation, during the first run of the first step, the parameter is set to the extreme value which is within the possible range of values and furthest from the original value of the parameter. If (for example, in the second step) it is recognized that the limit value for the maximum RF output or gradient performance is exceeded by this extreme value, the binary search can be canceled immediately with a negative result.

There are two variations for determination of the still possible range of values during the first run of the first step. The first variation is an interrelated range of values. In the second variation, the still possible range of values is determined by drawing up a list in which all the still possible parameter values of the respective parameter are compiled in a corresponding sequence. The center of the respective still possible range of values corresponds to the center of the list or a corresponding part of the list in this variation. A combination of the first and second variation with the aforementioned preferred variation is possible.

The parameters of the imaging sequence may be one or more of the following parameters:

The flip angle of an RF pulse of the imaging sequence. To reduce the RF output (both the maximum value and the temporal mean value), the flip angle should be reduced.

The type of RF pulse of the imaging sequence. Types which exist include, for example, a rapid type (short duration of the RF pulse, i.e. narrow pulse) and a type with a low SAR load (SAR="Specific Absorption Rate") for the patient, which has a longer duration (i.e. a wider pulse). To reduce the maximum RF output, for example, the type can be changed from rapid to the type with the low SAR-load or a wider pulse selected.

The repetition time (TR) after which the imaging sequence is repeated. To reduce both the temporal mean value of the RF output and the temporal mean value of the amount of temporal change of the gradient performance, the repetition time can be increased.

The number of slices in which the MR data is recorded. To reduce the mean value of the RF output, for example, the number of slices can be reduced.

The slice thickness. To reduce the temporal mean value of the amount of temporal change of the gradient performance, for example, the slice thickness can be increased.

The interval between certain elements (e.g. radio frequency pulses or gradient moments) of the imaging sequence. To reduce the temporal mean value of the RF output, for example, a waiting time, e.g. between the readout module and the following RF excitation pulse, can be included in the imaging sequence, resulting in an increased interval between certain elements of the imaging sequence.

The slew rate of a gradient moment. To reduce both the maximum value of the amount of temporal change of the gradient performance and the temporal mean value of this amount, the slew rate can be reduced, resulting in an increased rise time.

The resolution with which the MR data is recorded. To reduce the temporal mean value of the amount of temporal change of the gradient performance, for example, the resolution can be increased.

In the aforementioned description of various parameters of the imaging sequence, in each case the effects of corresponding changes in these parameters on the RF output and the gradient performance of the magnetic resonance system are explained. With this information, the magnetic resonance system can automatically change the parameters of the imaging sequence such that the altered imaging sequence does not violate the predetermined limit values.

According to a further embodiment of the invention, the parameter to be changed is or the parameters to be changed are each shown together with the parameters automatically determined by the control computer to a user of the magnetic resonance apparatus. The altered sequence is performed by the magnetic resonance apparatus to record the MR data only when confirmation is received from the user of the changes shown.

According to this embodiment, protocol changes (i.e. changes to the parameters of the imaging sequence) are shown to a user in a kind of user dialog. The altered imaging sequence is not performed by the magnetic resonance system to record the MR data until this user accepts the changes automatically created by the magnetic resonance system.

According to a further embodiment of the invention, a range of values for one or more of the parameters can be specified (for example, by a user). The specification of a range of values may also include the specification of an (upper and/or lower) limit for a parameter which must not be exceeded. In the automatic determination or alteration of parameters to avoid exceeding the predetermined limit values, the magnetic resonance system takes account of the specified range of values in each case by only selecting parameter values from this respective range of values.

This embodiment enables the user to release (only) certain parameters for the automatic alteration of these parameters in case the parameter values originally selected might result in a violation of the predetermined limit values. By only specifying corresponding value ranges for certain parameters, on the one hand, with this automatic change only those parameters for which a corresponding range of values was specified will be changed, and only parameter values from the predetermined range of values are automatically selected by the magnetic resonance system to change the respective parameters. In this embodiment, the user can specify, for example, that the flip angle may at most be reduced to a value X.

This embodiment advantageously enables the parameters of the imaging sequence to only be altered in a manner specified by the user if the parameter values originally specified by the user might lead to a violation of the limit values so that, for example, a query by the control computer as to whether the user agrees to the automatic change can be omitted. In this embodiment, the workflow is therefore advantageously not even interrupted (e.g. by a user query) if the original parameter values might lead to a violation of the FPO:B specifications.

The present invention also encompasses a magnetic resonance apparatus for recording MR data of an examination object. The magnetic resonance apparatus has an MR data acquisition scanner that has a basic field magnet, a gradient field system, at least one RF antenna and a control computer that controls the gradient field system and the at least one RF antenna so as to receive measurement signals or MR data recorded by the RF antennae. The control computer is designed so as to create or receive a sequence with which the MR data are to be recorded, and to determine a maximum RF output and a maximum gradient performance of the magnetic resonance system during the notional performance of the sequence with the magnetic resonance system simulating the sequence, and to verify whether the maximum RF output and/or the maximum gradient performance violate predetermined limit values, and to cause the sequence to be performed to record the MR data only if the previous verification showed that the limit values are not violated.

The advantages of the magnetic resonance apparatus according to the invention essentially correspond to the advantages of the method according to the invention, which were explained in detail above.

The present invention also encompasses a non-transitory, computer-readable data storage medium encoded with programming instructions (program code), which can be loaded into the memory of a programmable control computer of a magnetic resonance apparatus so as to cause all or various aforementioned embodiments of the method according to the invention to be performed when the computer code is executed by the control computer. The program code may require program resources, e.g. libraries and auxiliary functions to realize the corresponding embodiments of the method. The code can be a source code (e.g. C++), which is still being compiled and linked or that only needs to be interpreted, or executable software code that, for performance, only needs to be loaded into the control computer.

The electronically readable data carrier can be, e.g. a DVD, a magnetic tape, a hard disk or a USB stick on which electronically readable control information is stored.

The present invention enables patients with an implant to also be examined by means of a magnetic resonance system without the examination being cancelled during recording of the MR data due to the FPO:B criteria being violated. The patient may, for example, have one or more of the following implants:

a pacemaker,
an implanted defibrillator,
an implanted automatic administration device for medicinal products,
a brain stimulator (e.g. for curbing pain or tremor),
a spinal cord implant.

According to the FPO:B specification, two different aspects, namely the maximum RF output and the maximum gradient performance of the magnetic resonance system, must be taken into account. This means that the automatic determination of parameter values must take both aspects into account and in particular, the combination of both aspects. In doing so, it should be noted that the effects of the alteration of certain parameters of the imaging sequence influence both these aspects independently of each other so that according to the invention, changes of several parameters must be undertaken to avoid the violation of predetermined limit values in certain cases.

For example, it is assumed that an imaging sequence violates both the limit value with regard to the maximum RF output (B1 peak value) and the limit value with regard to the maximum gradient performance (peak value of dB/dt). In this case, the slew rate of the gradient moments can be reduced in order to reduce the maximum gradient performance, and the flip angle can be reduced in order to reduce the maximum RF output. In other words, two parameters (the slew rate and the flip angle) must be altered to avoid infringing the limit values with regard to the maximum RF output and the maximum gradient performance. According to the invention, this is achieved by the maximum RF output and the maximum gradient performance of the magnetic resonance system being determined by a simulation of the performance of the respectively altered sequence, resulting in combinations of parameter value changes also being correctly recorded.

BRIEF DESCRIPTION OF THE DRAWINGS

In FIG. 1 is a block diagram of a magnetic resonance apparatus according to the invention.

FIG. 2 is a flowchart of the method according to the invention.

DESCRIPTION OF THE PREFERRED EMBODIMENTS

FIG. 1 is a block diagram of a magnetic resonance apparatus 5 according to the invention (a magnetic resonance imaging or tomography apparatus). The apparatus 5 has a data acquisition scanner that has a basic field magnet 1 that generates a temporally constant strong magnetic field for the polarization or alignment of nuclear spins in an examination area of an object O such as a part of a human body, lying on a table 23 in the magnetic resonance apparatus 5. The high homogeneity of the basic field that is necessary for the nuclear magnetic resonance measurement is defined in a typically spherical measuring volume M, in which the volume region of the human body for examination is arranged. To support homogeneity requirements, and particularly to eliminate time-invariable influences, shim plates of ferromagnetic material are attached at suitable locations. Time-variable influences are eliminated by shim coils 2 operated by a shim coils supply (amplifier).

A cylindrical gradient field system 3 composed of three sub-windings is present in the scanner. Each sub-winding is supplied with power by an amplifier to generate a linear (also temporally modifiable) gradient field in a respective direction of a Cartesian coordinate system. The first sub-winding of the gradient field system 3 generates a gradient $G_x$ in the x-direction, the second sub-winding a gradient $G_y$ in the y-direction, and the third sub-winding a gradient $G_z$ in the z-direction. Each amplifier has a digital-to-analog converter, which is controlled by a sequence controller 18 for the correctly timed generation of gradient pulses.

Within the gradient field system 3 there are one (or more) radio frequency antennae 4, which convert the radio frequency pulses emitted by a radio frequency power amplifier into an alternating magnetic field for excitation of the nuclei and deflection of nuclear spins of the examination object O, or an area of the examination object O. Each RF antenna 4 has one or more RF transmitter coils and one or more RF receiver coils in the form of an annular, preferably linear or matrix-shaped, arrangement of component coils. The alternating field originating from the precessing nuclear spins, usually nuclear spin echo signals provoked by a pulse sequence of one or more radio frequency pulses and one or more gradient pulses, is converted by the RF receiver coils of the respective RF antenna 4 into a voltage (measurement signal), which is supplied via an amplifier 7 to a radio frequency receive channel 8 of a radio frequency system 22. The radio frequency system 22, which is part of a control computer 10 of the magnetic resonance apparatus 5, furthermore has a transmission channel 9 in which the radio frequency pulses for the excitation of the magnetic nuclear resonance are generated. The respective RF pulses are represented digitally in the sequence controller 18 as complex numbers. This sequence of numbers is supplied as a real part and an imaginary part via respective inputs 12 to a digital-to-analog converter in the radio frequency system 22, and from this to the transmission channel 9. In the transmission channel 9, the pulse sequences are modulated onto a radio-frequency carrier signal that has a base frequency that corresponds to the resonance frequency of the nuclear spins in the measuring volume.

Switching between transmission and reception modes takes place via a transmitting/receiving diplexer 6. The RF transmitter coils of the radio frequency antenna(e) 4 emit the RF pulses for the excitation of the nuclear spin into the measuring volume M and resultant echo signals are scanned by way of the RF receiver coil(s). The corresponding magnetic resonance signals obtained are phase-sensitively demodulated to an intermediate frequency in the receive channel 8' (first demodulator) of the radio frequency system 22, digitized in the analog-to-digital converter (ADC) and emitted via the output 11. This signal is also demodulated to the frequency 0. Demodulation to a frequency 0 and separation into a real and imaginary part takes place in a second demodulator 8 after digitization in the digital domain. An MR image is reconstructed by an image processor 17 from the measurement data thus obtained via the output 11. Management of the measurement data, the image data and the control programs takes place by way of the system computer 20. From a specification with control programs, the sequence controller 18 controls the generation of the pulse sequences desired in each case and the corresponding scanning of k-space. In particular, the sequence controller 18 controls the correctly timed switching of the gradients, the emission of RF pulses with defined phase amplitude, and the receipt of magnetic resonance signals. The time base for the radio frequency system 22 and the sequence controller 18 is made available by a synthesizer 19. The available control programs for recording MR data and generating an MR image are stored on a DVD 21, and the presentation of the generated MR image takes place at a terminal 13 having a keyboard 15, a mouse 16 and a monitor 14.

FIG. 2 shows a flowchart of a method according to the invention for recording MR data of an (in particular, living) examination object with a magnetic resonance system.

In a step S1, an imaging sequence with which the MR data of the examination object is scanned is created by or provided to the system computer 20. In a step S2, value ranges are determined for certain parameters of this imaging sequence. With these value ranges, on the one hand the user specifies which parameters of the imaging sequence may be changed automatically by the system computer 20. Parameters for which the user does not specify a range of values in step S2 may not be changed automatically by the system computer 20.

In the first run in step S3, the original imaging sequence created or provided in step S1 is simulated to determine the maximum RF output and the maximum gradient performance of the magnetic resonance scanner by the simulation. Step S4 then examines whether the maximum RF output determined in step S3 and the maximum gradient performance determined in step S3 violate predetermined limit values (in particular, the FPO:B specification). If this is not the case, the method branches into step S6, in which the sequence is performed with the aid of the magnetic resonance system to record the MR data of the examination object. The method ends after this step S6.

If it is recognized in step S4 that the maximum RF output and the maximum gradient performance determined by the simulation violate the predetermined limit values, one or more of the parameters of the imaging sequence is or are changed in the subsequent step S5. The value ranges predetermined in step S2 are taken into account in this change performed automatically by the system computer 20. On the one hand, this means that only those parameters for which value ranges were determined in step S2 are changed. On the other hand, the parameters are changed such that the altered parameter value is within the range of values of the respective parameter specified in step S2. Then in step S3 the sequence changed in this way is simulated again to determine the maximum RF output and the maximum gradient performance of the altered sequence. Finally, in step S4 it is examined again in turn whether the maximum RF output and the maximum gradient performance still violate the limit values. If this is no longer the case, step S6 is performed and the method finished. However, if this is still the case, steps S5, S3 and S4 are repeated until either a sequence is found which neither violates the limit values for the maximum RF output nor the limit values for the maximum gradient performance, or until a cancelation criterion is met so that the method according to the invention is finished without the performance of step S6 (this variation is not shown in FIG. 2).

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus comprising:
    in a control computer of an MR apparatus comprising an MR data acquisition scanner, acquiring a data acquisition sequence that will be used to operate the MR data acquisition scanner to acquire MR data from a subject having an active implanted medical device therein, said data acquisition sequence comprising RF pulses that produce an RF output and gradient pulses that control entry of said MR data into a memory organized as k-space;
    in said control computer, simulating or analyzing any part of said sequence that is less than all said sequence, in order to determine a maximum radio frequency (RF) output, and simulating or analyzing only gradient pulses in said sequence that cause entry of said MR data into a periphery of k-space in order to determine maximum gradient performance, that will occur in said MR data acquisition scanner during execution of said sequence;
    in said control computer, verifying whether either of said maximum RF output and said maximum gradient performance violate predetermined limit values imposed by standards for conducting MR examinations of subjects with an active implanted medical device therein; and
    from said control computer, emitting an output signal that causes said MR data acquisition sequence to be executed by said MR data acquisition scanner to acquire said MR data only if the verification showed that the limit values are not violated for both said RF output and said maximum gradient performance.

2. A method as claimed in claim 1 comprising, in said control computer, verifying whether either of the maximum RF output and the maximum gradient performance violate the predetermined limit values by executing at least one verification selected from the group consisting of verifying whether a maximum value of the RF output of the MR data acquisition scanner is larger than a first limit value for magnetic flux density during execution of said MR data acquisition sequence, verifying whether a temporal mean value of the RF output of the MR data acquisition scanner is larger than a second limit value for magnetic flux density during execution of said MR data acquisition sequence, verifying whether a maximum value of an amount of a temporal alteration of the gradient performance of the MR data acquisition scanner is larger than a first limit value for an alteration of magnetic flux density per time unit during execution of said MR data acquisition sequence, and verifying whether a temporal mean value of an amount of a temporal alteration of the gradient performance of the MR data acquisition scanner is larger than a second limit value for an alteration of magnetic flux density per time unit during execution of said MR data acquisition sequence.

3. A method as claimed in claim 1 comprising, in said control computer, if the limit values are violated, determining which of said limit values is violated and determining a percentage by which the determined limit value is violated.

4. A method as claimed in claim 1 comprising, in said control computer, if the limit values are violated, determining at least one parameter of said MR data acquisition sequence and a parameter value for each parameter that, when the MR data acquisition sequence is modified to give said at least one parameter said parameter value, the MR data acquisition sequence then does not violate the limit values.

5. A method as claimed in claim 4 comprising, in said control computer, determining said at least one parameter and said parameter value for each parameter by implementing a binary search comprising:
    setting said at least one parameter to a value in a center of a still possible range of values;

simulating or analyzing whether the limit value corresponding to the modified parameter is violated by the modified sequence;

restricting the still possible range of values to half of said range, dependent on the result of said simulating or analyzing; and cancelling said binary search if a predetermined cancellation criterion is not satisfied.

6. A method as claimed in claim 4 comprising selecting said at least one parameter from the group consisting of a flip angle of an RF pulse of said MR data acquisition sequence, a type of RF pulse in said MR data acquisition sequence, a repetition time with which said MR data acquisition sequence is repeated, a number of slices from which MR data are acquired in said MR data acquisition sequence, a thickness of a slice from which MR data are acquired in said MR data acquisition sequence, an interval between selected components of said MR data acquisition sequence, a slew rate of a gradient moment in said MR data acquisition sequence, and a resolution with which the MR data are acquired in said MR data acquisition sequence.

7. A method as claimed in claim 4 comprising:
at a display screen in communication with said control computer, displaying said at least one parameter with the determined parameter value thereof; and
changing said MR data acquisition sequence according to said at least one parameter with the determined parameter value, and not executing said MR data acquisition sequence to acquire MR data until confirmation from a user is received as an input into said control computer.

8. A method as claimed in claim 4 comprising determining a range of values for each of said at least one parameter, determining said at least one parameter and said parameter value therefore only from parameter values within said range in order to not violate the limit values.

9. A magnetic resonance (MR) apparatus comprising:
an MR data acquisition scanner comprising a basic field magnet, a gradient field system, at least one radio frequency (RF) antenna;
a control computer configured to acquire a data acquisition sequence that will be used to operate the MR data acquisition scanner to acquire MR data from a subject having an active implanted medical device therein, said data acquisition sequence comprising RF pulses that produce an RF output and gradient pulses that control entry of said MR data into a memory organized as k-space;
said control computer being configured to simulate or analyze any part of said sequence that is less than all said sequence, in order to determine a maximum radio frequency (RF) output, and to simulate or analyze only gradient pulses in said sequence that cause entry of said MR data into a periphery of k-space in order to determine maximum gradient performance, that will occur in said MR data acquisition scanner during execution of said sequence;
said control computer being configured to verify whether either of said maximum RF output and said maximum gradient performance violate predetermined limit values imposed by standards for conducting MR examinations of subjects with an active implanted medical device therein; and
said control computer being configured to emit an output signal that causes said MR data acquisition sequence to be executed by said MR data acquisition scanner to acquire said MR data only if the verification showed that the limit values are not violated for both said RF output and said maximum gradient performance.

10. A non-transitory, computer-readable data storage medium encoded with programming instructions, said storage medium being loaded into a control computer of a magnetic resonance (MR) apparatus that comprises an MR data acquisition scanner, said programming instructions causing said control computer to:
acquire a data acquisition sequence that will be used to operate the MR data acquisition scanner to acquire MR data from a subject having an active implanted medical device therein, said data acquisition sequence comprising RF pulses that produce an RF output and gradient pulses that control entry of said MR data into a memory organized as k-space;
simulate or analyze said sequence any part of said sequence that is less than all in order to determine a maximum radio frequency (RF) output, and simulate or analyze only gradient pulses in said sequence that cause entry of said MR data into a periphery of k-space in order to determine maximum gradient performance, that will occur in said MR data acquisition scanner during execution of said sequence;
verify whether either of said maximum RF output and said maximum gradient performance violate predetermined limit values imposed by standards for conducting MR examinations of subjects with an active implanted medical device therein; and
emit an output signal that causes said MR data acquisition sequence to be executed by said MR data acquisition scanner to acquire said MR data only if the verification showed that the limit values are not violated for both said RF output and said maximum gradient performance.

\* \* \* \* \*